United States Patent
Sasaki

(10) Patent No.: US 6,518,785 B2
(45) Date of Patent: Feb. 11, 2003

(54) METHOD FOR MONITORING AN AMOUNT OF HEAVY METAL CONTAMINATION IN A WAFER

(75) Inventor: Yasushi Sasaki, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 10/008,030

(22) Filed: Nov. 5, 2001

(65) Prior Publication Data

US 2002/0039650 A1 Apr. 4, 2002

Related U.S. Application Data

(62) Division of application No. 09/349,864, filed on Jul. 8, 1999, now abandoned.

(30) Foreign Application Priority Data

Jul. 9, 1998 (JP) .............................. 10-193507

(51) Int. Cl.⁷ .............................................. G01R 31/26
(52) U.S. Cl. .................... 324/765; 324/719; 117/2; 438/14; 438/17
(58) Field of Search ............... 117/2, 928, 4; 438/14, 17; 324/719, 765

(56) References Cited

U.S. PATENT DOCUMENTS

| | | | |
|---|---|---|---|
| 4,668,330 A | * | 5/1987 | Golden .................. 156/601 |
| 4,706,493 A | | 11/1987 | Chang et al. |
| 5,418,172 A | * | 5/1995 | Falster et al. .................. 437/8 |
| 5,698,771 A | | 12/1997 | Shields et al. |
| 5,788,763 A | * | 8/1998 | Hayashi et al. .................. 117/2 |

FOREIGN PATENT DOCUMENTS

| | | |
|---|---|---|
| JP | 06342839 | 12/1994 |
| JP | 08-037216 | 2/1996 |
| JP | 10070165 | 3/1998 |

OTHER PUBLICATIONS

Japanese Patent Office Action dated Feb. 20, 2001.

* cited by examiner

Primary Examiner—Deborah Jones
Assistant Examiner—Stephen Stein
(74) Attorney, Agent, or Firm—Katten Muchin Zavis Rosenman

(57) ABSTRACT

In order to monitor the amount of heavy metal contamination in a wafer, the monitoring method comprising the steps of: setting a wafer for monitoring an amount of heavy metal contamination in a prescribed monitoring place, performing thermal treatment to the wafer at a temperature in the range from 1150° C. to 1350° C. in an atmosphere of $O_2$+He or an atmosphere of $H_2$+He, performing thermal treatment to the wafer at a temperature in the range from 900° C. to 1000° C. in an atmosphere of $N_2$+$O_2$ or an atmosphere of $O_2$, and measuring an amount of heavy metal contamination in the wafer.

1 Claim, 2 Drawing Sheets

(a)

PRIOR ART MONITORING WAFER

MONITORING WAFER ACCORDING TO THE PRESENT INVENTION

(b)

METHOD FOR MONITORING AN AMOUNT OF HEAVY METAL CONTAMINATION IN A WAFER

CROSS REFERENCE TO RELATED APPLICATION

This application is a divisional of application Ser. No. 09/349,864 now abandoned, filed on Jul. 8, 1999.

BACKGROUND OF THE INVENTION

1. Field of the Invention

The present invention relates to a wafer for a heavy metal monitor and a method for monitoring an amount of heavy metal contamination in a wafer, which is capable of measuring the degree of heavy metal contamination with good accuracy, even in a manufacturing process in which a large-diameter wafer of 8 inches or 12 inches and over is being processed.

2. Description of the Related Art

In the past, in a process for manufacturing a semiconductor, heavy metal contamination, which causes a deterioration of the characteristics of a semiconductor, such as with regard to leakage, was measured and monitored by a minority carrier lifetime measurement apparatus which made use of the $\mu$-PCD method (microwave photoconductive decay).

In particular, because it was advantageous to have the wafer that is used for this monitoring be the same size as the wafer being processed, as the size of silicon wafers grew, in order to achieve rigidity with respect to stress, the thickness of the wafer grew large, the result being that the apparent lifetime became long, this hindering measurement with good accuracy.

FIG. 3 shows the method for monitoring heavy metal in the past. This wafer is subjected to thermal oxidation at a temperature in the range from 900° C. to 1000° C. in an atmosphere of $O_2$ or in an atmosphere of $N_2$ and $O_2$, thereby achieving thermal treating for the purpose of preventing surface recombination.

However, a metal such as titanium, which has a low diffusion coefficient, is introduced into the oxide film during thermal treating, in which case there is a further deterioration of the measurement accuracy.

Accordingly, it is an object of the present invention to improve on the drawbacks of the prior as noted above, by providing a novel wafer which enables measurement of the amount of heavy metal contamination with good accuracy, even in a process of manufacturing a large-diameter wafer, and a further object to provide a method for monitoring an amount of heavy metal contamination in a wafer.

Another object of the present invention is to provide a novel wafer for monitoring heavy metal contamination that is capable of measuring of the amount of metal contamination with good accuracy, while suppressing the measurement error that is introduced by the introduction of a metal such as titanium, which has a low diffusion coefficient, into the oxide film.

SUMMARY OF THE INVENTION

In order to achieve the above-noted objects, the present invention adopts the following basic technical constitution.

The aspect of the present invention is a method for monitoring the amount of the heavy metal contamination on a wafer, this method comprising the steps of;

setting a wafer for monitoring an amount of heavy metal contamination in a prescribed monitoring place, performing thermal treatment to the wafer at a temperature in the range from 1150° C. to 1350° C. in an atmosphere of $O_2$+He or an atmosphere of $H_2$+He, performing thermal treatment to the wafer at a temperature in the range from 900° C. to 1000° C. in an atmosphere of $N_2$+$O_2$ or an atmosphere of $O_2$, and measuring an amount of heavy metal contamination in the wafer.

In a method for monitoring the amount of heavy metal contamination on a wafer, by measuring minority carriers lifetime, this method having a step of thermal treatment at a temperature in the range from 1150° C. to 1350° C. in an inert light element gas atmosphere of $O_2$+He or an atmosphere of $H_2$, +He, and a step of thermal treatment at a temperature in the range from 900° C. to 1000° C. in an atmosphere of $N_2$+$O_2$ or an atmosphere of $O_2$, and by means of these steps, it is possible to eliminate the measurement error that occurs because of the inclusion of a metal such as titanium, which has a low diffusion coefficient, into the oxide film during thermal treating, thereby resulting in the achievement of good measurement accuracy.

DESCRIPTION OF THE PREFERRED EMBODIMENTS

Embodiments of a wafer for heavy metal monitoring according to the present invention are described in detail below, with references being made to relevant accompanying drawings.

Figure 1:
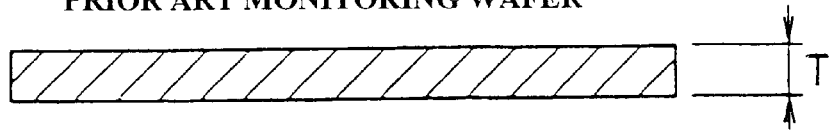
FIG. 1 is a drawing that shows a monitor wafer according to the present invention, with FIG. 1(a) being a cross-section view of the wafer, showing the first embodiment, and FIG. 1(b) being a plan view of a wafer, showing the second embodiment.
Figure 1:
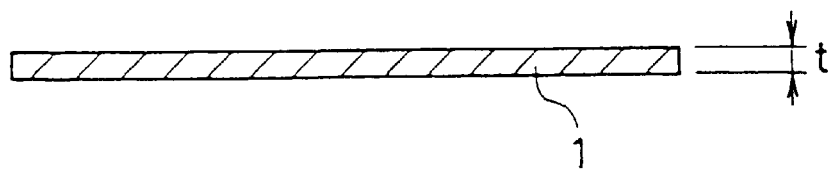
Figure 1:
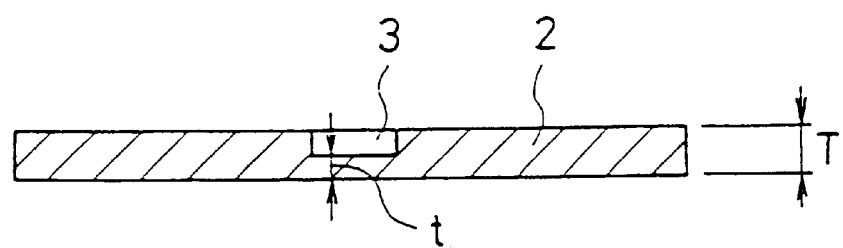

FIG. 1(a) is a drawing that shows the structure of an example of a wafer for heavy metal monitoring according to the present invention, with FIG. 1(a) showing a wafer for heavy metal monitoring, wherein for the purpose of monitoring the amount of heavy metal contamination on a wafer, the thickness t of a wafer 1 is made smaller than a prescribed standard wafer thickness T with respect to the wafer diameter.

In the manufacturing processes for manufacturing a semiconductor integrated circuit, in the case in which the microwave photoconductive decay method is employed to monitor, by measuring the minority carrier lifetime, the amount of heavy metals, which cause deterioration of the transistor characteristics such as with regard to leakage, whereas in the method of the prior art a heavy metal monitor wafer having a standard thickness (725 $\mu$m for an 8-inch wafer, 775 $\mu$m for a 12-inch wafer), in the case of the present invention a wafer having a thickness in the range from 250 $\mu$m to 700 $\mu$m is used.

In the above-noted case, at below 250 $\mu$m, problems arise in the transport of the wafer, for example, due to sag of the wafer because of its thinness. Specifically, it had been advantageous to use a wafer having the same thickness as a 6-inch wafer.

It has been theoretically and experimentally determined that the minority carrier lifetime that is obtained using the microwave PCD method is lengthened in proportion to the square of the wafer thickness, so that for a given heavy metal contamination level, the apparent lifetime is lengthened. Because of this, the present invention makes the wafer thickness 675 μm, so that it is possible to maintain a correct correlation between the sensitivity coefficient and the heavy metal contamination amount.

Figure 2:
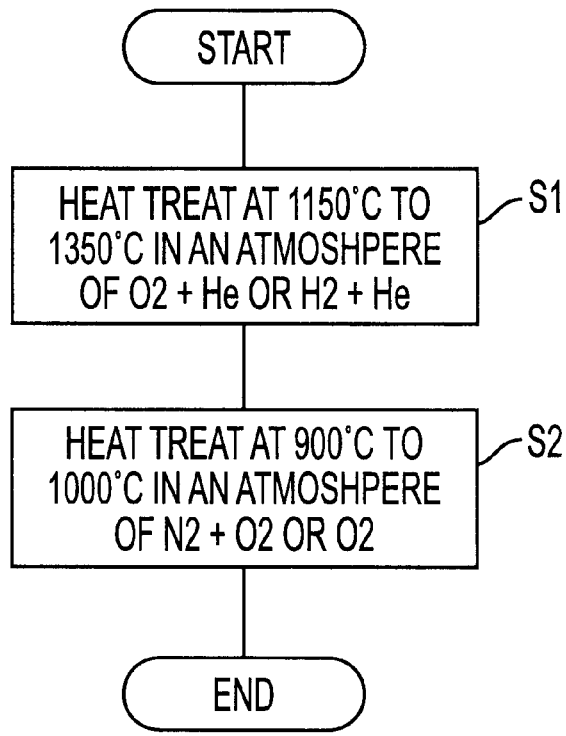
FIG. 2 is a drawing that shows the monitoring processes according to the present invention.
Figure 3:
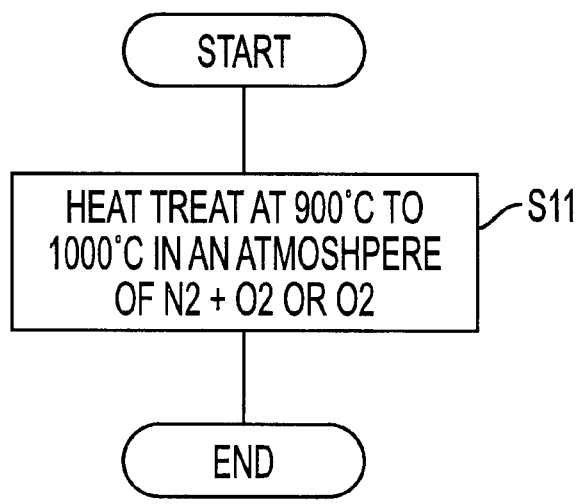
FIG. 3 is a drawing that shows the monitoring processes of the prior art.

FIG. 2 is a flowchart that shows the monitoring method of the present invention, this drawing showing a method for monitoring heavy metals contamination in a wafer by measuring minority carrier lifetime, the method including setting a wafer for monitoring an amount of heavy metal contamination in a prescribed monitoring place, performing thermal treatment to the wafer at a temperature in the range from 1150° C. to 1350° C. in an atmosphere of $O_2$+He or an atmosphere of $H_2$+He, performing thermal treatment to the wafer at a temperature in the range from 900° C. to 1000° C. in an atmosphere of $N_2$+$O_2$ or an atmosphere of $O_2$, and measuring an amount of heavy metal contamination in the wafer.

Specifically, in the present invention, in order to prevent as much as possible the intrusion of the heavy metal such as titanium, which has a low diffusion coefficient with respect to silicon, into an oxide film, before the above-noted thermal treating, the temperature is set in the range from 1150° C. to 1350° C., and to eliminate errors that occur in the minority carrier lifetime because of crystal defects, a thermal treating step is provided which is performed in an inert light element gas atmosphere of $H_2$ or He.

By virtue of the above-noted constitution, it is possible to suppress the deterioration of the sensitivity coefficient that is caused by inclusion of a metal such as titanium into the oxide film that is formed during thermal oxidation that is performed for the purpose of preventing surface recombination, and it is also possible to eliminate the cause of errors in lifetime decay due to crystal defects.

FIG. 1(b) is a drawing that shows the structure of another embodiment of a wafer for heavy metal monitoring, and FIG. 1(b) shows a heavy metal monitoring wafer in which a heavy metal monitoring region 3 is provided on a wafer 2, the thickness t of this heavy metal monitoring region 3 being less than a prescribed standard wafer thickness T with respect to the diameter of the wafer 2.

In the past, when the monitor carrier lifetime measurement method was used to monitor heavy metal contamination during the manufacturing process, bare silicon having the standard thickness was used for measurement of the lifetime. In the present invention, however, in order to achieve a high sensitivity in the measurement of lifetime commensurate with advances in the manufacturing processes, a chip for the purpose of monitoring lifetime is provided in a thin part having a thickness of 675 μm at the region 3 in the center part of the wafer.

Of course, the thickness in the above-noted region 3 in the center part can be set in the range from 250 μm to 700 μm, and this region does not absolutely need to be provided in the center part of the wafer.

In the present invention, the thickness of the wafer used for monitoring is established so as to be 675 μm, which is less than the standard wafer thickness, this type of wafer being used to perform lifetime measurement, thereby enabling the maintenance of a correctly correlated sensitivity coefficient, obtained from the correlation between the heavy metal contamination amount and the lifetime value, thereby enabling an improvement in measurement accuracy.

What is claimed is:

1. A method for monitoring an amount of heavy metal contamination in a wafer by measuring minority carrier lifetime, said method comprising the steps of:

setting a wafer for monitoring an amount of heavy metal contamination in a prescribed monitoring place, performing thermal treatment to said wafer at a temperature in the range from 1150° C. to 1350° C. in an atmosphere of $O_2$+He or an atmosphere of $H_2$+He, performing thermal treatment to said wafer at a temperature in the range from 900° C. to 1000° C. in an atmosphere of $N_2$+$O_2$ or an atmosphere of $O_2$, and measuring an amount of heavy metal contamination in the wafer.

* * * * *